United States Patent
Visokay et al.

(10) Patent No.: US 6,696,332 B2
(45) Date of Patent: Feb. 24, 2004

(54) BILAYER DEPOSITION TO AVOID UNWANTED INTERFACIAL REACTIONS DURING HIGH K GATE DIELECTRIC PROCESSING

(75) Inventors: Mark Robert Visokay, Richardson, TX (US); Antonio Luis Pacheco Rotondaro, Dallas, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/176,596

(22) Filed: Jun. 21, 2002

(65) Prior Publication Data
US 2003/0116804 A1 Jun. 26, 2003

Related U.S. Application Data
(60) Provisional application No. 60/344,670, filed on Dec. 26, 2001.

(51) Int. Cl.[7] .................. H01L 21/8238; H01L 21/336; H01L 21/31; H01L 27/108; H01L 29/76
(52) U.S. Cl. .............. 438/216; 438/261; 438/287; 438/785; 257/310; 257/410
(58) Field of Search .............. 438/770, 785, 438/591, 216, 261, 791, 792, 954, 269, 783, 240; 257/310, 410, 411, 406

(56) References Cited

U.S. PATENT DOCUMENTS

| | | | |
|---|---|---|---|
| 5,927,992 A | * | 7/1999 | Hodges et al. .............. 438/439 |
| 6,291,867 B1 | | 9/2001 | Wallace et al. |
| 6,518,634 B1 | * | 2/2003 | Nguyen et al. ............. 257/406 |

* cited by examiner

Primary Examiner—Donghee Kang
(74) Attorney, Agent, or Firm—Peter K. McLarty; W. James Brady, III; Frederick J. Telecky, Jr.

(57) ABSTRACT

Methods are disclosed for forming gate dielectrics for MOSFET transistors, wherein a bilayer deposition of a nitride layer and an oxide layer are used to form a gate dielectric stack. The nitride layer is formed on the substrate to prevent oxidation of the substrate material during deposition of the oxide layer, thereby avoiding or mitigating formation of low-k interfacial layer.

12 Claims, 7 Drawing Sheets

FIG. 9

BILAYER DEPOSITION TO AVOID UNWANTED INTERFACIAL REACTIONS DURING HIGH K GATE DIELECTRIC PROCESSING

RELATED APPLICATION

This application claims priority to Serial No. 60/344,670 filed Dec. 26, 2001, which is entitled "Bilayer Depositions to Avoid Unwanted Interfacial Reactions during High K Gate Dielectric Processing".

FIELD OF INVENTION

This invention relates generally to semiconductor devices and methods for fabricating MOSFET devices having high-k gate dielectric stacks.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a metal or polysilicon gate contact is energized to create an electric field within a semiconductor channel, by which current is allowed to conduct between a source region and a drain region. The source and drain regions are typically formed by adding dopants to targeted regions on either side of the channel region in a semiconductor substrate. A gate dielectric is formed over the channel region, and a gate contact (e.g., metal or doped polysilicon) is formed over the gate dielectric. The gate dielectric is an insulator material, which prevents large currents from flowing from the gate into the channel when a voltage is applied to the gate contact, while allowing such an applied gate voltage to set up an electric field in the channel region in a controllable manner.

Figure 1A:
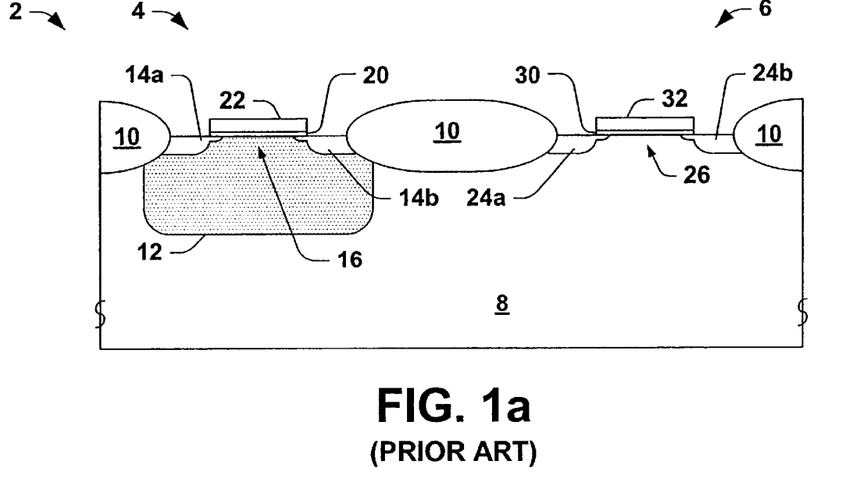
FIG. 1a is a partial side elevation view in section illustrating a conventional semiconductor device with NMOS and PMOS transistors.

FIG. 1a illustrates a conventional semiconductor device 2 with both PMOS and NMOS transistor devices 4 and 6, respectively. The device 2 is fabricated using conventional complimentary MOS (CMOS) processing techniques in a semiconductor substrate 8, in which isolation structures (e.g., SiO2 field oxide (FOX) or shallow trench isolation (STI) structures) 10 are formed to separate and provide electrical isolation of the individual devices 4 and 6 from other devices and from one another. The substrate 8 is lightly doped p-type silicon with an N-well 12 formed therein under the PMOS transistor 4. The PMOS device 4 includes two laterally spaced P-doped source/drain regions 14a and 14b with a channel region 16 located therebetween. A gate is formed over the channel region 16 comprising an insulative gate dielectric layer 20, such as silicon dioxide (SiO2) overlying the channel 16 and a conductive polysilicon gate contact structure 22 formed over the gate dielectric layer 20.

The NMOS device 6 includes two laterally spaced N-doped source/drain regions 24a and 24b with a channel region 26 located therebetween. A gate is formed over the channel region 26 comprising an insulative gate dielectric layer 30, such as silicon dioxide (SiO2) overlying the channel 26 and a conductive polysilicon gate contact structure 32 formed over the gate dielectric layer 30. Typical CMOS production processing has thusfar not adopted high-k gate dielectric layers, although such layers are being studied. Instead, the gate dielectric layer 30 of FIG. 1a is typically formed through thermal oxidation of the silicon substrate 8 to form the layer 30 of SiO2.

In operation, the resistivity of the channel 26 may be controlled by the voltage applied to the gate contact 32, by which changing the gate voltage changes the amount of current through channel 26. The gate contact 32 and the channel 26 are separated by the gate dielectric stack 30, which is an insulator. Thus, little or no current flows between the gate contact 32 and the channel 26, although "tunneling" current is observed with thin dielectrics. However, the gate dielectric allows the gate voltage to induce an electric field in channel 26, by which the channel resistance can be controlled by the applied gate voltage.

Field-effect transistors such as transistors 4 and 6 of FIG. 1a are physically very small in many cases, whereby many such devices may be formed on a single-crystal silicon substrate or chip and interconnected in an integrated circuit. In the field of semiconductor device technology, there is a continuing trend toward higher device densities, and hence smaller and smaller device dimensions. Generally, device density is improved by scaling or decreasing the size of the transistors and other electrical components. At the same time, however, MOSFET devices produce an output signal proportional to the ratio of the width over the length of the channel, where the channel length is the physical distance between the source/drain regions (e.g., between regions 24a and 24b in the device 6) and the width runs perpendicular to the length (e.g., perpendicular to the page in FIG. 1a). Thus, scaling the MOSFET device 6 to make the width narrower may reduce the device output. Previously, this characteristic has been accommodated by decreasing the thickness of gate dielectric 30, thus bringing the gate contact 32 closer to the channel 26 for the device 6 of FIG. 1a. Making the gate dielectric layer 30 smaller, however, has other effects, which may lead to performance tradeoffs.

In particular, there are limitations in the use of silicon dioxide in the formation of thinner gate dielectric layers. For instance, extremely thin SiO2 layers allow for large gate tunneling leakage currents due to direct tunneling through the oxide. This problem is exacerbated by limitations in the ability to deposit such thin films with uniform thickness. Thus, it has been found that MOSFET operating parameters may change dramatically due to slight variations in gate dielectric thickness. Furthermore, thin gate dielectric layers are known to provide poor diffusion barriers to impurities. Thus, for example, extremely thin SiO2 gate dielectric layers suffer from high boron penetration into the underlying channel region during implantation of source/drain regions outlying the channel region. Consequently, recent efforts at MOSFET device scaling have focused on alternative dielectric materials which can be formed in a thicker layer than scaled silicon dioxide layers and yet still produce the same field effect performance. These materials are often referred to as high-k materials because their dielectric constants are greater than that of SiO2. The relative performance of such high-k materials is often expressed as equivalent oxide thickness (EOT), because the alternative material layer may be thicker, while providing the equivalent electrical effect of a much thinner layer of SiO2.

Figure 1B:
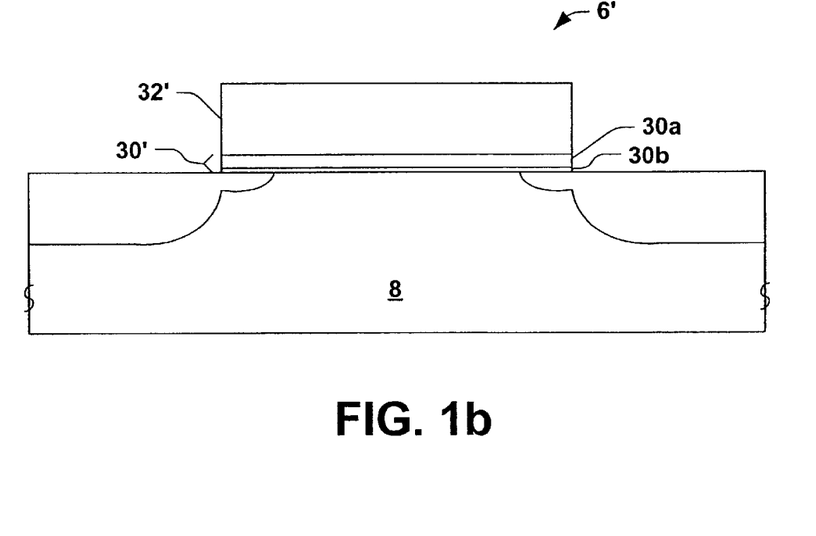
FIG. 1b is a partial side elevation view in section illustrating a low-k interfacial layer in a proposed gate structure.

Referring to FIG. 1b, one proposed alternative structure for applying high-k gate dielectric materials in a gate dielectric layer 30' is illustrated in a MOSFET device 6' including a layer of dielectric (e.g., oxide) material 30a deposited using standard deposition processing techniques, such as chemical vapor deposition (CVD) or sputtering processes. A conductive polysilicon gate contact structure 32' is then formed over the gate dielectric layer 30a. However, an undesirable (e.g., low-k) interfacial layer 30b is formed between the substrate 8 and the deposited oxide 30a.

The interfacial layer 30b is not directly deposited, but instead is the result of oxidation of the substrate material 8 during deposition of the oxide layer 30a.

Figure 2:
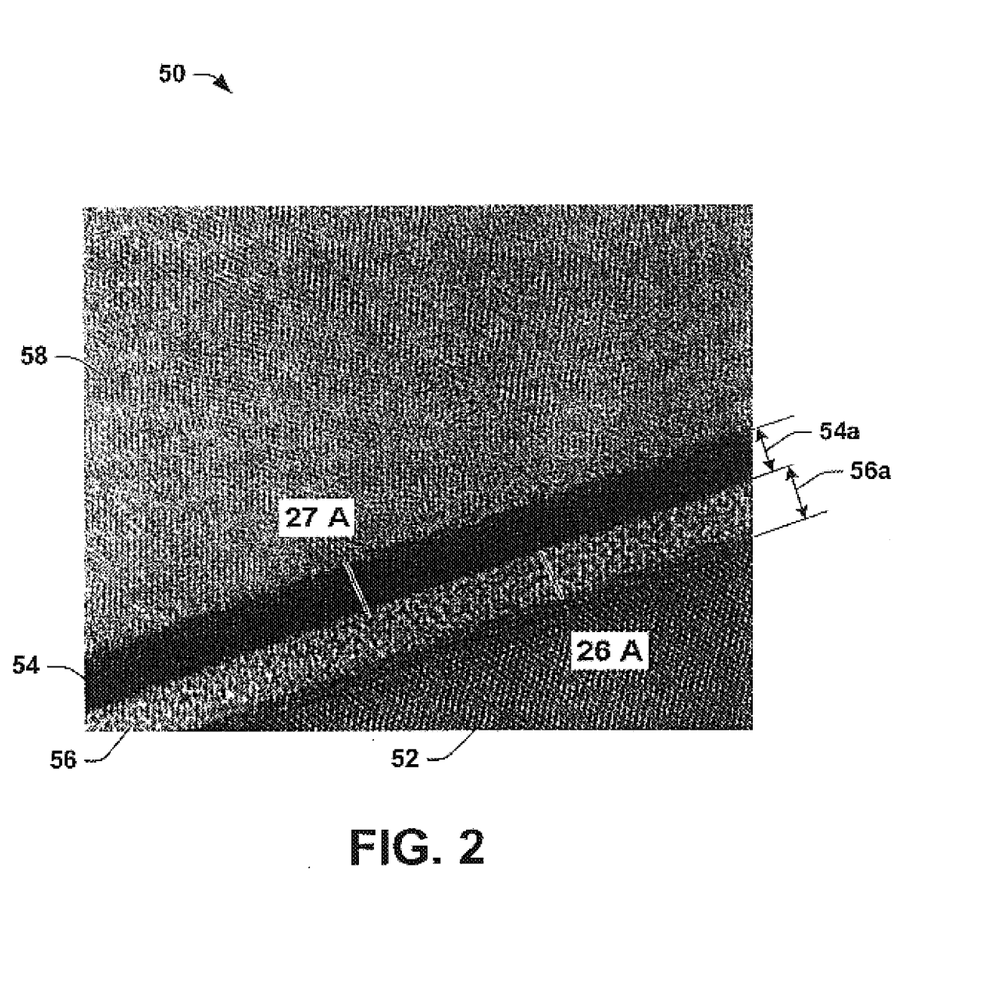
FIG. 2 is a partial side elevation view in section illustrating a low-k interfacial layer in a MOS device gate structure.

Referring also to FIG. 2, a sectional TEM view is provided of a portion of an actual high-k gate structure 50 overlying a semiconductor substrate 52. In the gate structure 50, an interfacial layer 56 is formed during sputtering deposition of a hafnium silicon oxide dielectric layer 54 with O2 employed in the deposition process. The deposited gate dielectric layer 54 is illustrated underlying a subsequently deposited polysilicon gate contact layer 58. During deposition of the oxide material layer 54, the low-k interfacial layer 56 is formed between the substrate 52 and the gate dielectric layer 54, due to deposition process related oxidation of the substrate 52. Thus, from FIG. 2 it is seen that the relative thicknesses 54a and 56a of the gate dielectric and the interfacial layers, respectively, can be quite significant in practice (e.g., about 27 Å and 26 Å, respectively).

At the same time, however, the alternative materials explored thusfar are typically comprised of oxygen components, and are often deposited using oxidizing deposition processes. As a result, these substitute or alternative gate dielectric materials also suffer from the formation of the interfacial layer (e.g., layer 30b in FIG. 1b) during sputtering or CVD type deposition. For example, where high-k metal oxides are deposited, such as tantalum pentoxide, titanium dioxide, and barium strontium titanate, hafnium dioxide, aluminum oxide, hafnium silicate, the oxygen ambient or oxygen-containing precursor in the deposition process tends to also oxidize the silicon substrate, producing an interfacial oxide layer (e.g., layer 30b) at the interface between the substrate and the gate dielectric. The presence of this interfacial oxide layer increases the effective oxide thickness, reducing the effectiveness of the alternative gate dielectric approach. Thus, the interfacial oxide layer 30b limits the effectiveness of such alternative dielectric field effect devices.

Thus, in attempting to provide an oxide thickness equivalent to that of a very thin SiO2 layer, sputtered and CVD deposited high-k oxide gate materials suffer from the formation of low-k interfacial layers. The low-k interfacial layer, in turn, decreases the overall capacitance of the dielectric stack (e.g., gate dielectric stack 30) due to series capacitor effects. Consequently, there remains a need for improved scaling techniques by which high-k dielectric materials can be employed in forming gate dielectric layers while mitigating or avoiding the adverse effects of low-k interfacial layers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for forming gate dielectric structures for MOSFET devices, wherein high-k dielectric or other gate oxide materials can be deposited while avoiding or mitigating the formation of uncontrolled low-k interfacial layers. Thus, the invention provides significant advances in the further scaling of MOSFET devices, allowing flexibility in the selection and employment of new and improved high-k dielectric materials.

One aspect of the invention involves using bilayer gate dielectric stack structures, where a first layer in the stack is a nitride layer (other than silicon nitride (SiN) or nitrided silicon) deposited over the substrate. Some examples of nitrides which may be employed include hafnium silicon nitride, zirconium silicon nitride, hafnium nitride, and zirconium nitride, although other compositions are contemplated as falling within the scope of the invention. As used hereinafter, the term nitride layer is used to refer to such materials and others, apart from silicon nitride (SiN) and nitrided silicon. An oxide layer is then deposited over the nitride layer, which can be of any high-k material, such as tantalum pentoxide, titanium dioxide, barium strontium titanate, hafnium oxide, zirconium oxide, aluminum oxide, hafnium silicon oxide, zirconium silicon oxide, hafnium aluminum oxide, zirconium aluminum oxide, strontium titanium oxide, or others. The inventors have found that this technique can be advantageously employed to eliminate or reduce the formation of a low-k interfacial oxide layer due to the absence or reduced presence of reactive oxygen during the initial nitride layer deposition process. Thus, the invention provides for gate dielectric stack formation without low-k interfacial layer formation found in conventional dielectric stacks.

Another aspect of the invention provides for controlled oxidation of the nitride layer, either during deposition of the overlying oxide layer, or in a separate thermal annealing process. For example, the ambient deposition environment used in depositing the oxide layer may be employed to transform the initial nitride layer (either partially or wholly) to oxide in a controlled fashion, while at the same time, the nitride layer protects the underlying silicon substrate from oxidation. In this manner, the nitride layer can serve as a sacrificial layer, and the relative thicknesses of the nitride and oxide layers can be tailored to either fully oxidize the initial nitride layer, or to leave a desired portion thereof unoxidized.

Alternatively or in combination, the nitride layer thickness may be adjusted relative to that of the oxide layer so as to allow a reduced oxidation of the underlying silicon substrate relative to the conventional case where no nitride layer is present. This technique may be advantageously employed to ensure that the initial layers in the stack include a controllable amount of silicon dioxide, to mitigate or avoid mobility degradations associated with metal at the interface. Another aspect provides for a controlled post-deposition oxidation, such as through a thermal annealing process, to either fully or partially oxidize the nitride layer, and/or to form a controllable amount of SiO2 at the bottom of the gate dielectric stack. The oxide deposition processing and the post-deposition oxidation processing may be employed individually or in combination, in order to controllably oxidize a desired amount of the nitride layer. The invention thus provides significant processing advantages in the manufacture and design of scaled MOSFET devices, which can be employed in association with various deposition processes, such as an atomic layer deposition process (ALD), CVD, and sputtering deposition.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

One or more implementations of the present invention will now be described with reference to the attached drawings, wherein like reference numerals are used to refer to like elements throughout. The invention relates to methodologies for forming MOSFET gate dielectric stacks, by which one or more of the deficiencies or constraints in the prior art may be mitigated or overcome. Although illustrated and described hereinafter with respect to specific implementations of MOSFET devices, the invention finds utility in association with transistors apart from those illustrated herein, and all such applications are deemed as falling within the scope of the appended claims.

Figure 3:
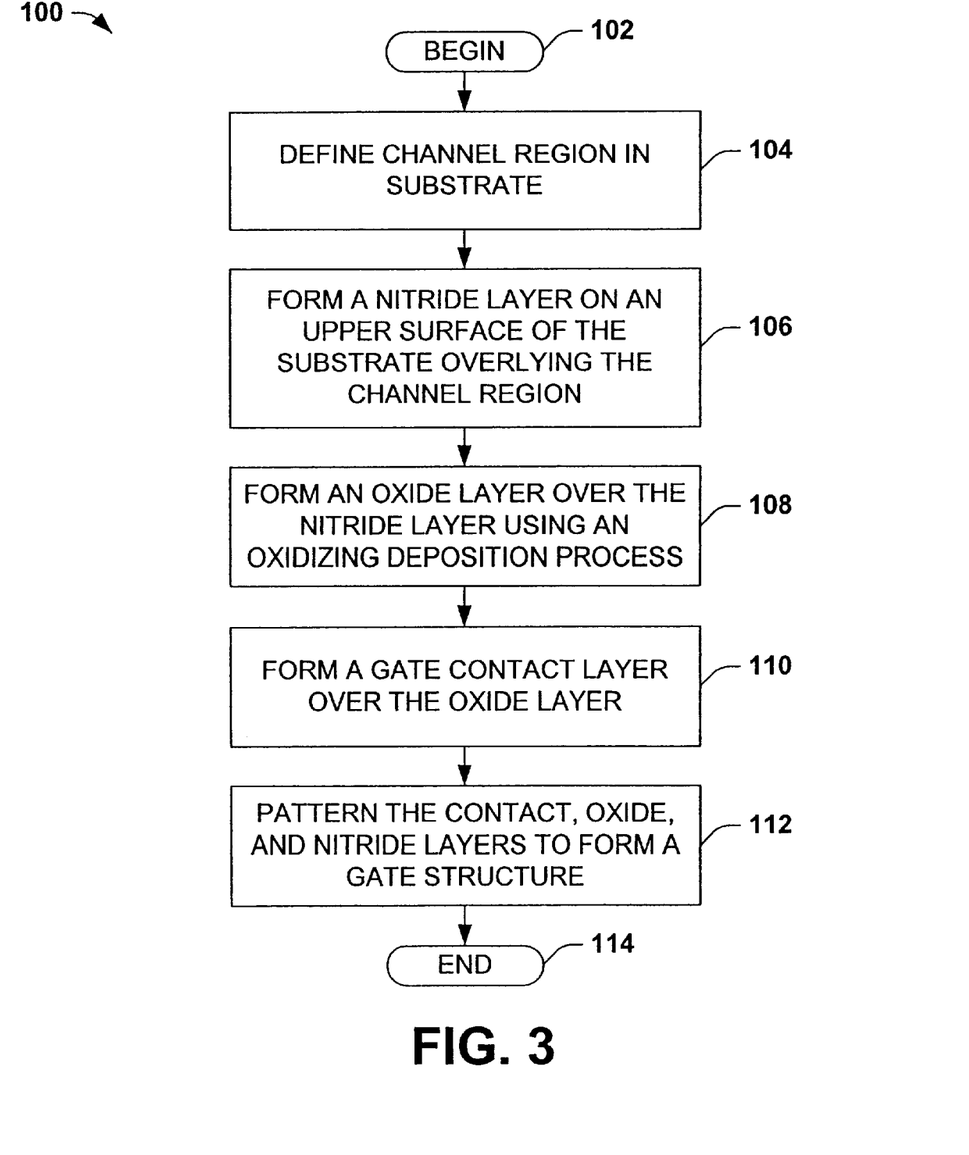
FIG. 3 is a flow diagram illustrating an exemplary method of fabricating a MOSFET gate dielectric stack structure in accordance with an aspect of the present invention.

Referring to FIG. 3, an exemplary method 100 is illustrated for forming a MOSFET gate dielectric structure in accordance with the invention. Although the method 100 and other exemplary methods are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

Beginning at 102, a channel region is defined in a substrate at 104 and a nitride layer is formed on a upper substrate surface overlying the channel region at 106. Formation of the nitride layer at 106 may comprise depositing a nitride material on the substrate using a non-oxidizing deposition process, such as sputtering, ALD or CVD deposition in a non-oxidizing ambient. Any appropriate nitride material may be deposited at 106, such as hafnium silicon nitride, zirconium silicon nitride, hafnium nitride, zirconium nitride, or the like. The nitride layer formation process may, but need not, be done in a non-oxidizing ambient so as to mitigate oxidation of the underlying substrate material and the formation of undesired low-k interfacial layers. The nitride deposition, moreover, may involve controlling the thickness of the resulting nitride layer to achieve a desired subsequent oxidation of all or a portion of the nitride layer at a later processing step. For example, the nitride layer formation at 106 may comprise depositing hafnium nitride or hafniun silicon nitride to a thickness of about 5 Å or more and about 75 Å or less using a sputter deposition, ALD or CVD process.

Thereafter at 108, an oxide layer is formed over the nitride layer using an oxidizing deposition process. For instance, the oxide layer deposition process at 108 may be performed using ALD, CVD, sputtering, or other appropriate deposition techniques in an oxidizing ambient, so as to partially or completely oxidize the underlying nitride layer. Any desired oxide material may be selected for deposition at 108, including high-k materials such as tantalum pentoxide, titanium dioxide, barium strontium titanate, hafnium oxide, zirconium oxide, aluminum oxide, hafnium silicon oxide, zirconium silicon oxide, hafnium aluminum oxide, zirconium aluminum oxide, strontium titanium oxide, or the like. The oxide layer, moreover, may be formed at 108 to any desired thickness, such as about 5 Å or more and about 60 Å or less in one implementation. Thus, the resulting gate dielectric stack thickness may be about 10 Å or more and about 135 Å or less. A gate contact layer is then formed, such as by polysilicon deposition at 110 using known techniques, and the deposited layers are patterned at 112 to form a MOSFET gate structure before the method ends at 114. Thereafter, further back end process steps are performed, such as the formation of various contact layers and insulation layers (not shown) as are known.

Figure 8:
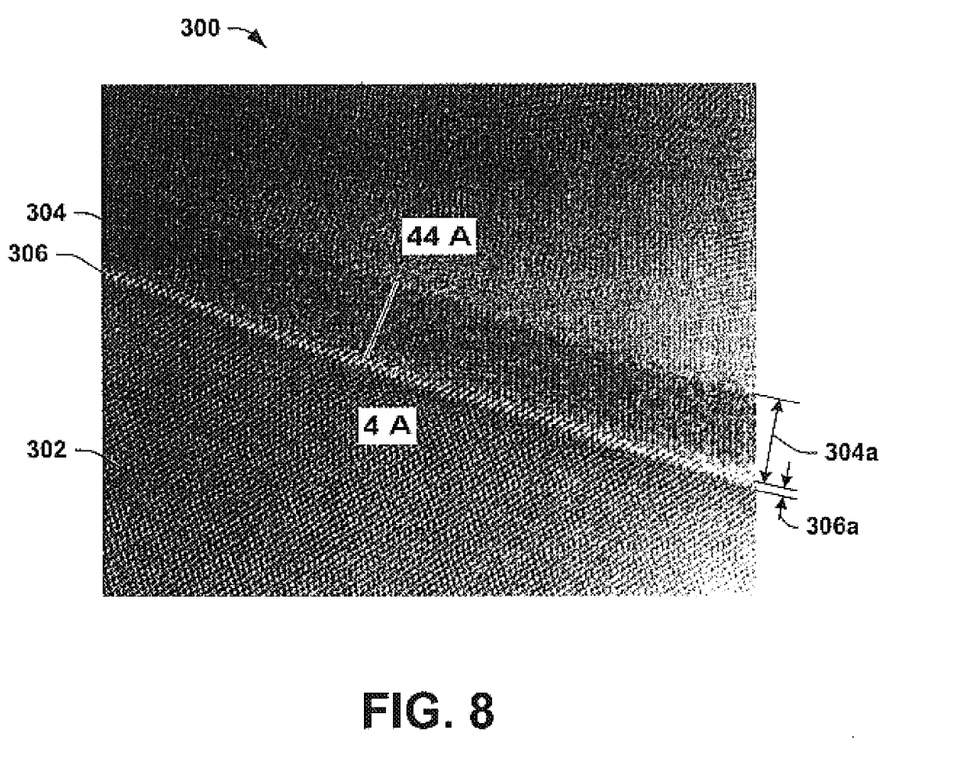
FIG. 8 is a partial side elevation view in section illustrating deposition of an initial nitride layer without formation of any significant interfacial layer in accordance with the invention.

Referring also to FIG. 8, the inventors have found that deposition of the initial nitride layer at 106 in the method 100 above may be employed to eliminate or mitigate formation of an interfacial oxide layer in the gate dielectric stack, due to the absence of reactive oxygen during the initial nitride layer deposition at 106. In FIG. 8, a sectional TEM view is provided of a portion of a partially formed gate structure 300, wherein an initial nitride layer 304 has been formed over a semiconductor substrate 302 in accordance with one implementation of the method 100. In the structure 300, only a very thin interfacial layer 306 is seen having a very small thickness 306a of about 4 Å or less, for a deposition of the nitride layer 304 having a thickness 304a of about 44 Å. Thus, it is seen from FIG. 8 that the deposition of the initial nitride layer according to the present invention can be accomplished without any significant interfacial layer.

In order to further illustrate various aspects of the invention, FIGS. 4–7 illustrate gate dielectric formation processing steps in association with an exemplary NMOS device 202. The device 202 comprises a prospective channel region 216 located between two spaced prospective source/ drain regions 214a and 214b in a p-type substrate 208. A gate structure is to be formed over the channel region 216, including a gate bilayer dielectric stack in accordance with the invention, and an overlying polysilicon gate contact structure. The source/drain regions 214 may be defined following gate formation, for example, through implantation of n-type dopant species using the gate structure for alignment of the source/drain regions 214.

Figure 4:
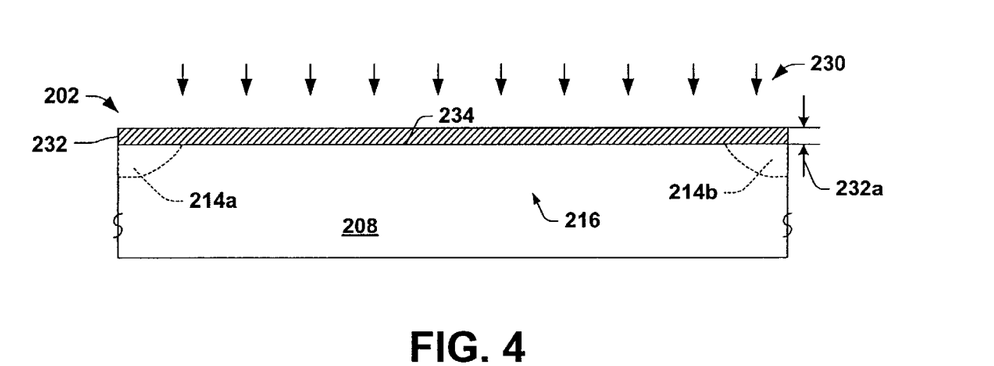
FIG. 4 is a partial side elevation view in section illustrating formation of a nitride layer over a substrate according to the invention.

In FIG. 4, a first deposition process 230 is performed, such as a CVD, ALD or sputtering process, in order to deposit an initial nitride layer 232 over the channel region 216 on an upper surface 234 of the substrate 208. The nitride layer 232 may be formed of any appropriate thickness 232a, according to the desired amount of subsequent oxidation desired during oxide deposition, such as about about 5 Å or more and about 75 Å or less. The nitride layer 232 may comprise any appropriate nitride material, including hafnium silicon nitride, zirconium silicon nitride, hafnium nitride, and zirconium nitride, although other compositions are contemplated within the scope of the invention. Thereafter, in FIG. 5a, an oxide layer 240 is deposited using a deposition process 242, providing oxide to a desired thickness 240a, such as about 5 Å or more and about 60 Å or less. The deposited oxide may comprise various materials, such as those having high dielectric constants, for example, tantalum pentoxide, titanium dioxide, barium strontium titanate, hafnium oxide, zirconium oxide, aluminum oxide, hafnium silicon oxide, zirconium silicon oxide, hafnium aluminum oxide, zirconium aluminum oxide, strontium titanium oxide, or others, in order to achieve a high-k dielectric stack for the device 202.

Figure 5A:
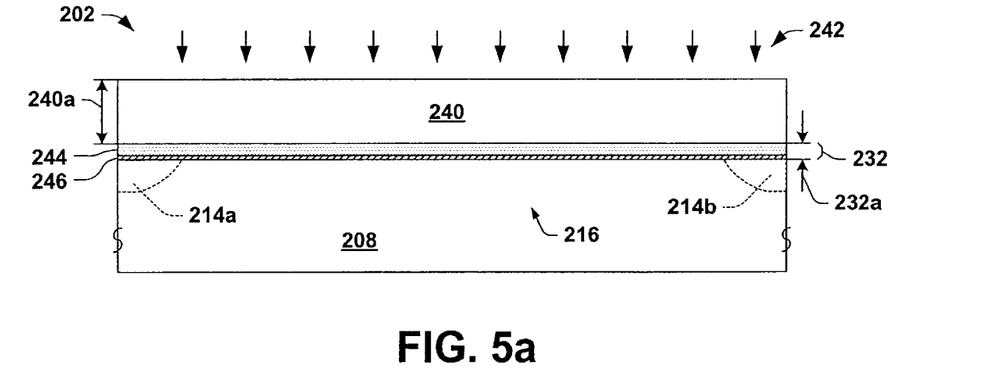
FIG. 5a is a partial side elevation view in section illustrating formation of an oxide layer over the nitride layer of FIG. 4 including partial oxidation of the nitride layer.

The second deposition process 242 may advantageously be performed in an oxidizing ambient to provide controlled oxidation of the nitride layer 232, whereby the nitride layer 232 serves as a sacrificial layer to protect against oxidation of the substrate 208, and to ensure that the interface between the dielectric stack and the substrate 208 includes silicon dioxide to mitigate or avoid mobility degradations associated with metal at the interface. Thus, as illustrated in FIG. 5a, the process 242 causes oxidation of a first portion 244 of the nitride layer 232, while leaving a second (e.g., lower) portion 246 unoxidized. The relative thicknesses of the oxidized and unoxidized portions 244 and 246, respectively, of the nitride layer 232 may be controlled, for example, by the relative deposition thicknesses 232a and 240a of the nitride and oxide layers 232 and 240, respectively, and/or through deposition process parameters and ingredients of the oxide deposition process 242. Thus, for instance, the process 242 may comprise sputter deposition of hafnium silicon oxide 240 to a thickness of about 5 to 60 Å with O2 in the process ambient.

Figure 5B:
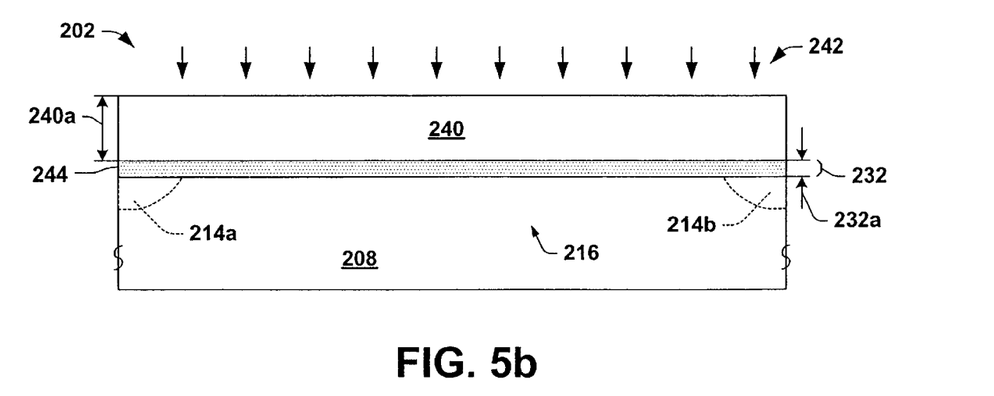
FIG. 5b is a partial side elevation view in section illustrating substantially complete oxidation of the nitride layer of FIGS. 4 and 5a in association with the oxide layer deposition process in accordance with another aspect of the invention.

Referring also to FIG. 5b, the process conditions during the oxide layer deposition and/or the relative thicknesses of the layers 232 and 240 may be tailored or selected so as to completely oxidize the material 244 in the nitride layer 232. Thus, the invention may be employed to control the amount of nitride layer oxidation to achieve any desired portion of oxidized material. Furthermore, the oxidation via the oxide deposition process 242 may be carried out so as to provide some controlled oxidation of the underlying substrate 208 as well. It will be appreciated that the invention thus provides process control over substrate oxidation not heretofore achievable using conventional techniques.

Figure 6:
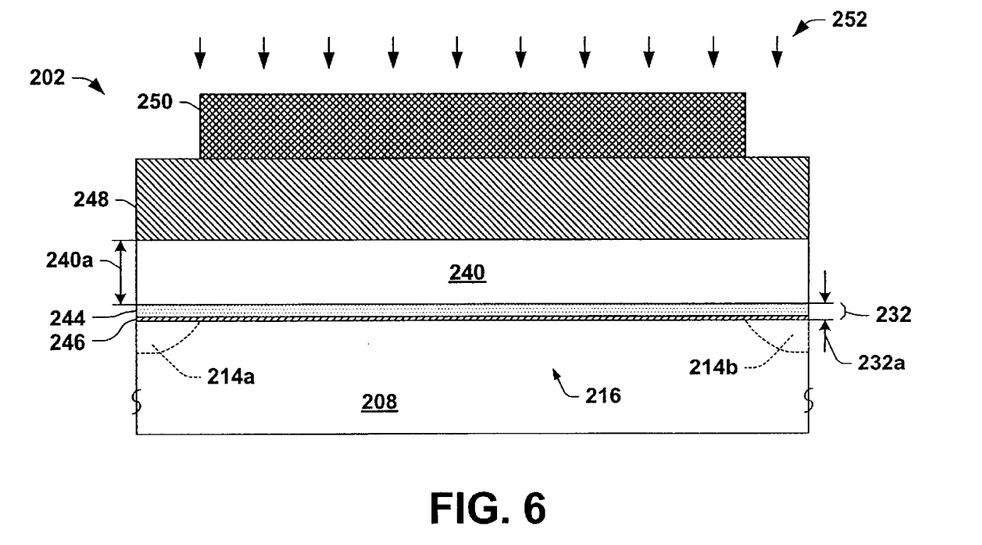
FIG. 6 is a partial side elevation view in section illustrating deposition of a polysilicon gate contact layer and a patterned etch process to form a gate structure.
Figure 7:
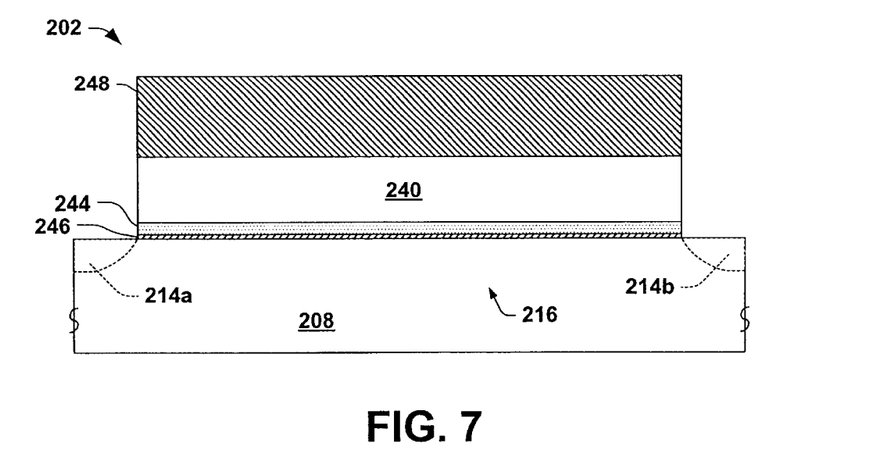
FIG. 7 is a partial side elevation view in section illustrating an exemplary high-k MOSFET gate dielectric structure in accordance with the invention.

Furthermore, the oxidation of the nitride layer 232 may be done alternatively or additionally using a thermal annealing process following the deposition processes 230 and 242, as illustrated and described further below with respect to FIG. 9. In FIG. 6, a polysilicon gate contact layer 248 is formed over the oxide layer 240 and a mask 250 is provided over the prospective channel region 216 on the polysilicon gate contact layer 248. The polysilicon deposition may be done according to known deposition techniques, and the mask 250 may be patterned using known lithographic processes. An etch process 252 is then employed to selectively remove exposed portions of the gate polysilicon contact layer 248 and the gate dielectric layers 240 and 232, in order to form the gate structure illustrated in FIG. 7.

Figure 9:
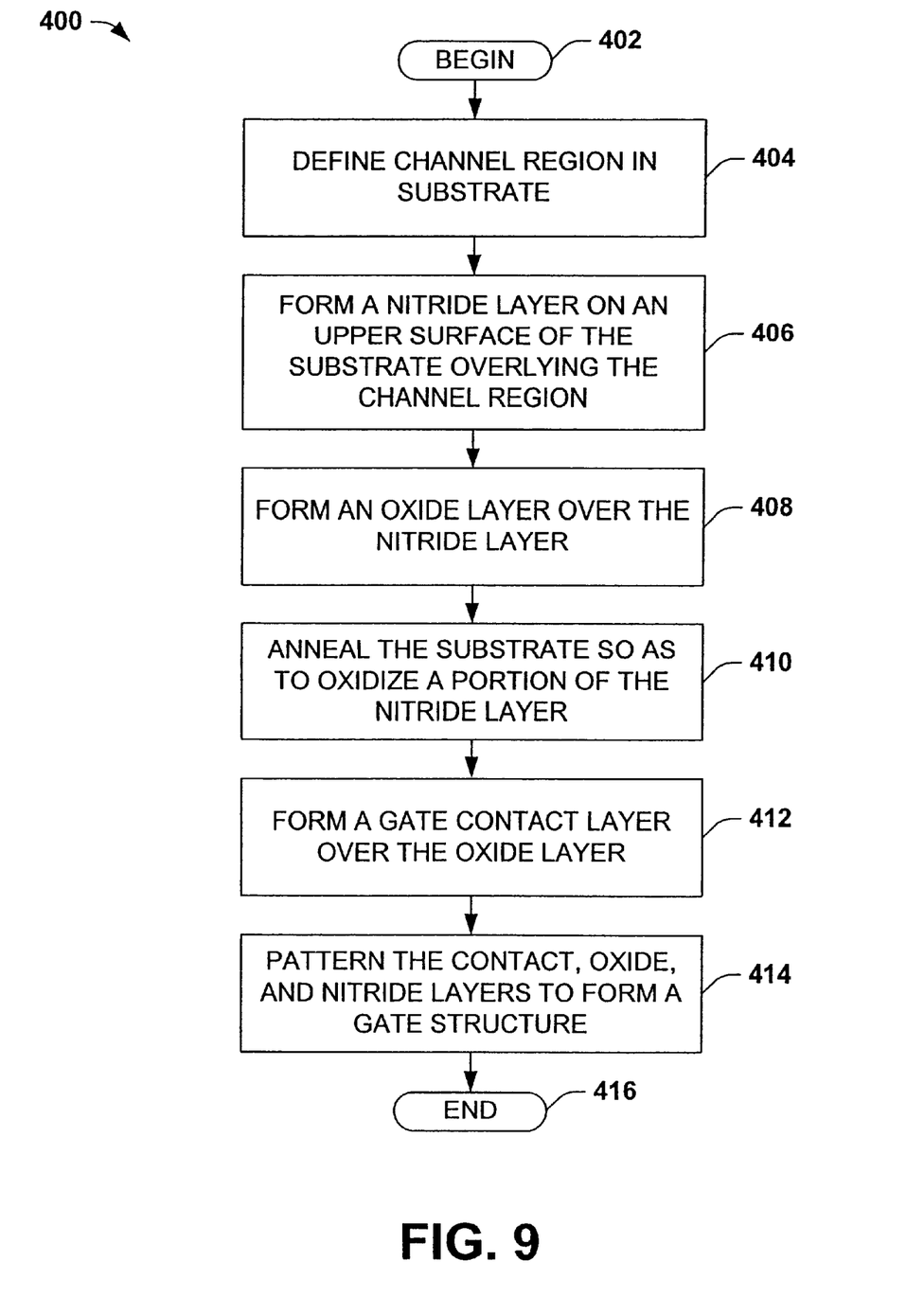
FIG. 9 is a flow diagram illustrating another method of fabricating a MOSFET gate dielectric structure in accordance with the invention.

Referring now to FIG. 9, another variation of the invention provides for thermal annealing of the device (e.g., device 202 of FIGS. 4–7) in order to oxidize some or all of the nitride layer (e.g., nitride layer 232) following deposition of the oxide layer. An exemplary method 400 is illustrated in FIG. 9 beginning at 402, wherein a channel region is defined at 404. Thereafter at 406, a nitride layer, such as those illustrated and described above, is formed on an upper surface of the substrate. The nitride layer formation at 406 may comprise, for example, CVD, ALD or sputter deposition of hafnium silicon nitride, zirconium silicon nitride, hafnium nitride, or zirconium nitride over the upper surface of the substrate to a layer thickness of about 5 Å or more and about 75 Å or less. An oxide layer is then formed at 408 over the nitride layer, such as using any desired high-k dielectric material and processes such as described above. The oxide deposition at 408 may, but need not, provide for some controlled oxidation of the nitride layer.

At 410, a thermal annealing process is employed to oxidize a portion of the nitride layer. It is noted at this point, that nitride layer oxidation may be achieved in a controlled fashion through one or both of the oxide layer deposition process at 408 and/or the annealing process at 410. For example, the annealing at 410 may provide more precise control over the amount of such oxidation than the oxide deposition process at 408. Thus in one implementation of the method 400, the oxide deposition at 408 may be used as a coarse oxidation adjustment, with the subsequent annealing at 410 operating as a fine adjustment, in order to provide any desired oxidation amount in a controlled fashion. Thereafter, a gate contact layer is formed over the oxide layer at 412 and the gate layers are patterned at 414, before the method 400 ends at 416.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a MOSFET gate dielectric structure in a semiconductor device, comprising:

forming a nitride layer on an upper surface of a semiconductor substrate, the nitride layer substantially overlying a channel region of the substrate wherein forming the nitride layer comprises depositing one of hafnium silicon nitride, zirconium silicon nitride, hafnium nitride, and zirconium nitride over the upper surface of the substrate;

forming an oxide layer over the nitride layer; and patterning the oxide and nitride layers to form a gate dielectric structure.

2. The method of claim 1, wherein forming the oxide layer comprises depositing one of tantalum pentoxide, titanium dioxide, barium strontium titanate, hafnium oxide, zirconium oxide, aluminum oxide, hafnium silicon oxide, zirconium silicon oxide, hafnium aluminum oxide, zirconium aluminum oxide, and strontium titanium oxide.

3. The method of claim 2, further comprising oxidizing at least a portion of the nitride layer substantially without oxidizing the substrate.

4. The method of claim 3, wherein oxidizing at least a portion of the nitride layer comprises annealing the substrate following the formation of the oxide layer.

5. The method of claim 3, wherein oxidizing at least a portion of the nitride layer comprises depositing the oxide layer using an oxidizing deposition process.

6. The method of claim 5, wherein oxidizing at least a portion of the nitride layer comprises depositing the oxide layer in an oxidizing ambient.

7. The method of claim 1, further comprising oxidizing at least a portion of the nitride layer without substantially oxidizing the substrate.

8. The method of claim 7, wherein oxidizing at least a portion of the nitride layer comprises depositing the oxide layer using an oxidizing deposition process.

9. The method of claim 8, wherein oxidizing at least a portion of the nitride layer comprises depositing the oxide layer in an oxidizing ambient.

10. The method of claim 7, wherein oxidizing at least a portion of the nitride layer comprises annealing the substrate following the formation of the oxide layer.

11. The method of claim 1, wherein forming the nitride layer comprises depositing nitride on the substrate using one of a chemical vapor deposition process and a sputtering process.

12. The method of claim 11, wherein forming the oxide layer comprises depositing oxide over the nitride layer using one of a chemical vapor deposition process and a sputtering process.

* * * * *